United States Patent
Shin et al.

(10) Patent No.: US 8,450,125 B2
(45) Date of Patent: May 28, 2013

(54) METHODS OF EVALUATING EPITAXIAL GROWTH AND METHODS OF FORMING AN EPITAXIAL LAYER

(75) Inventors: Dong-Suk Shin, Yongin-si (KR);
Yong-Joo Lee, Osan-si (KR);
Dong-Hyuk Kim, Seongnam-si (KR);
Myung-Sun Kim, Hwaseong-si (KR);
Hoi-Sung Chung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

(21) Appl. No.: 13/186,515

(22) Filed: Jul. 20, 2011

(65) Prior Publication Data
US 2012/0021537 A1   Jan. 26, 2012

(30) Foreign Application Priority Data
Jul. 22, 2010   (KR) .................. 10-2010-0070811

(51) Int. Cl.
*H01L 21/66*   (2006.01)
(52) U.S. Cl.
USPC .................. 438/17; 438/18; 257/E21.521
(58) Field of Classification Search
USPC .................. 257/E21.521; 117/201
See application file for complete search history.

(56) References Cited

U.S. PATENT DOCUMENTS

| | | | |
|---|---|---|---|
| 2002/0157485 A1* | 10/2002 | Cheong | 73/865.9 |
| 2009/0166676 A1* | 7/2009 | Lee et al. | 257/192 |
| 2010/0233598 A1* | 9/2010 | Matsunawa et al. | 430/30 |

FOREIGN PATENT DOCUMENTS

| | | | |
|---|---|---|---|
| JP | 2007-088234 A | 4/2007 | |
| JP | 2007-249167 A | 9/2007 | |
| KR | 10-2002-0083769 A | 11/2002 | |

* cited by examiner

*Primary Examiner* — Daniel Whalen
(74) *Attorney, Agent, or Firm* — Lee & Morse, P.C.

(57) ABSTRACT

A method of evaluating an epitaxial growing process includes forming a mold layer on each of a plurality of substrates, forming a photoresist pattern on each mold layer, the photoresist pattern having opening portions, a total area of a bottom portion of the opening portions being different for each substrate, patterning each mold layer to expose a surface portion of the substrate to form an evaluation pattern on each substrate, evaluation patterns including opening portions corresponding to the opening portion in the photoresist pattern, determining substrate opening ratios for each substrate based on the opening portions in the evaluation pattern thereon, the substrate opening ratios being different for each substrate, performing a selective epitaxial process on each substrate to form an epitaxial layer, and evaluating characteristics of the epitaxial layer for each substrate to determine an optimal substrate opening ratio.

18 Claims, 13 Drawing Sheets

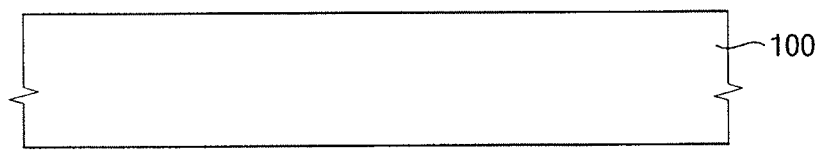
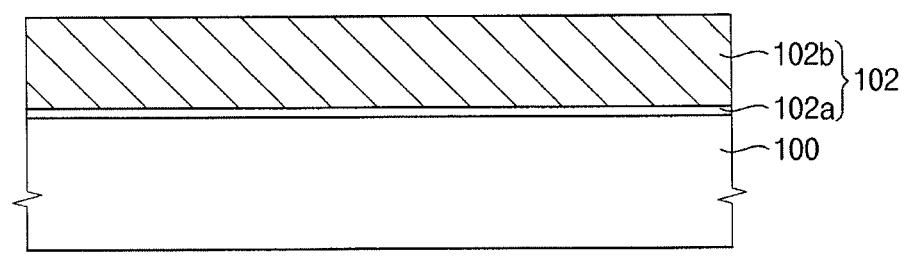
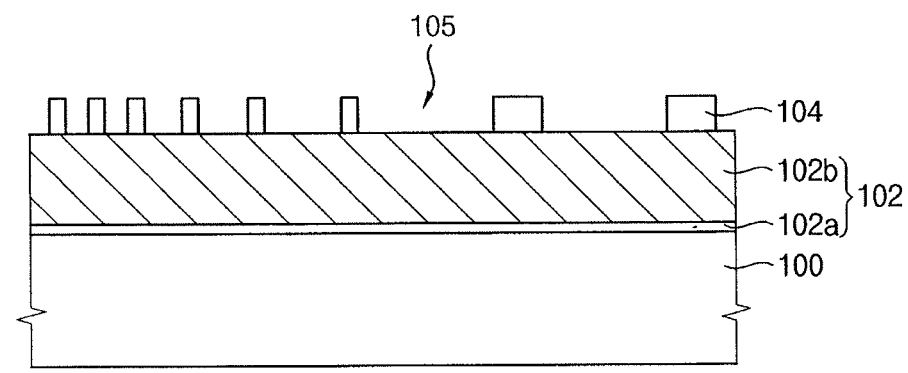

CIRCUIT REGION  DUMMY REGION

CIRCUIT REGION  DUMMY REGION

METHODS OF EVALUATING EPITAXIAL GROWTH AND METHODS OF FORMING AN EPITAXIAL LAYER

CROSS-REFERENCE TO RELATED APPLICATION(S)

Korean Patent Application No. 10-2010-0070811, filed on Jul. 22, 2010, in the Korean Intellectual Property Office, and entitled: "Method of Evaluation of an Epitaxial Growth Process and Method for Forming an Epitaxial Layer" is incorporated by reference herein in its entirety.

BACKGROUND

1. Field

Example embodiments relate to methods of evaluating epitaxial growth and methods of forming an epitaxial layer.

2. Description of the Related Art

A selective epitaxial growing process is one process for manufacturing semiconductor devices having a high performance. In accordance with the selective epitaxial growing process, silicon sources may be supplied to an exposed region of silicon through an activation of a gas phase reaction to grow a single crystalline layer including silicon. Growing aspects of silicon may vary depending on a shape of the exposed region of silicon. Particularly, a global loading effect exhibiting different epitaxial growing aspects over an entire surface of a substrate may be generated, in accordance with an increase or a decrease of an area around a portion where the selective epitaxial growing proceeds. Accordingly, in order to form an epitaxial layer having a desired thickness and including components necessary for the manufacture of a semiconductor device, an accurate evaluation on the epitaxial growing aspects in accordance with the global loading effect may be necessary.

SUMMARY

Embodiments are therefore directed to methods of evaluating epitaxial growth and methods of forming an epitaxial layer.

According to an example embodiment, there is provided a method of evaluating an epitaxial growing process including forming a mold layer on each of a plurality of substrates, forming a photoresist pattern (on the mold layer) having opening portions, a total area of a bottom portion of the opening portions being different for each substrate, patterning the mold layer to expose a surface portion of the substrate to form evaluation patterns on the substrate, the evaluation patterns including opening portions, determining substrate opening ratios for each substrate based on the opening portions (the substrate opening ratios being different for each substrate), performing a selective epitaxial process on the substrate to form an epitaxial layer, and evaluating characteristics of the epitaxial layer for each substrate to determine an optimal substrate opening ratio.

The photoresist pattern may be formed on a chip region of each substrate and each substrate may include a different number of chip regions exposed by the photoresist pattern. The opening portions of the evaluation patterns in each chip region may have a line shape or a circular shape and two or more different inner widths, and the density of the opening portions of each chip region may be different.

The method of evaluating an epitaxial growing process may further include evaluating characteristics of the epitaxial layer and a corresponding substrate opening ratio and a micro loading effect to identify an optimal substrate opening ratio associated with a low characteristic change.

The photoresist patterns formed in each chip region may have the same shape. The chip regions including the evaluation patterns may be similarly arranged on the substrate and uniformly disposed on an entire upper surface portion of the substrate. The photoresist pattern may be formed using an exposing mask for forming the mold layer pattern for performing an epitaxial growing process. The substrate opening ratio of the substrate based on the evaluation patterns may be between 5% and 30%.

The characteristics of the epitaxial layer to be evaluated may include an amount of elements contained in the epitaxial layer and a growing rate of the epitaxial layer. The epitaxial layer formed may include at least one of silicon germanium, single crystalline silicon, and silicon carbide.

According to an example embodiment, there is provided a method of forming an epitaxial layer, the method including forming a mold layer on each of a plurality of substrates, forming a photoresist pattern (on the mold layer) having opening portions, a total area of a bottom portion of the opening portions being different for each substrate, patterning the mold layer to expose a surface portion of the substrate to form evaluation patterns having opening portions, determining a substrate opening ratio based on the opening portions (the substrate opening ratio of each substrate being different), performing a selective epitaxial process on the substrate to form an epitaxial layer, evaluating characteristics of the epitaxial layer and a corresponding substrate opening ratio, determining an optimal substrate opening ratio for forming the epitaxial layer based on the characteristics of the epitaxial layer, adjusting an epitaxial growing process condition to achieve the optimal substrate opening ratio, and forming a final epitaxial layer by applying the optimal substrate opening ratio.

The photoresist pattern may be formed using an exposing mask used for forming a mold layer pattern for performing an epitaxial growing process. The adjusting an epitaxial growing process condition to achieve the optimal substrate opening ratio may include adjusting an area of a dummy pattern included in the exposing mask. The dummy pattern may have a regularly repeating shape. The optimal substrate opening ratio may be within a range of substrate opening ratios associated with an epitaxial layer growing rate, the epitaxial layer growing rate may be within 30%. The substrate opening ratio may be within a range of substrate opening ratios associated with a difference of an amount of elements contained in the epitaxial layer, the difference of an amount of elements being within 5% . The adjusting the epitaxial growing process condition to achieve the optimal substrate opening ratio may include changing a depositing process condition of the epitaxial layer.

According to an example embodiment, there is provided a method of evaluating an epitaxial growing process, the method including forming a mold layer on each of a plurality of substrates, patterning the mold layer to expose a surface portion of the substrate to form a plurality of patterns having opening portions, determining substrate opening ratios for each substrate based on the opening portions, the substrate opening ratios being different for each substrate, performing a selective epitaxial process on the substrate to form an epitaxial layer, evaluating characteristics of the epitaxial layer to identify a characteristic change for each substrate, and determining an optimal substrate opening ratio by identifying the substrate opening ratio corresponding to the least characteristic change.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2A to 2E illustrate cross-sectional views of stages in a method of evaluating an epitaxial layer growing process utilizing a substrate for evaluation.

DETAILED DESCRIPTION

Figure 1:
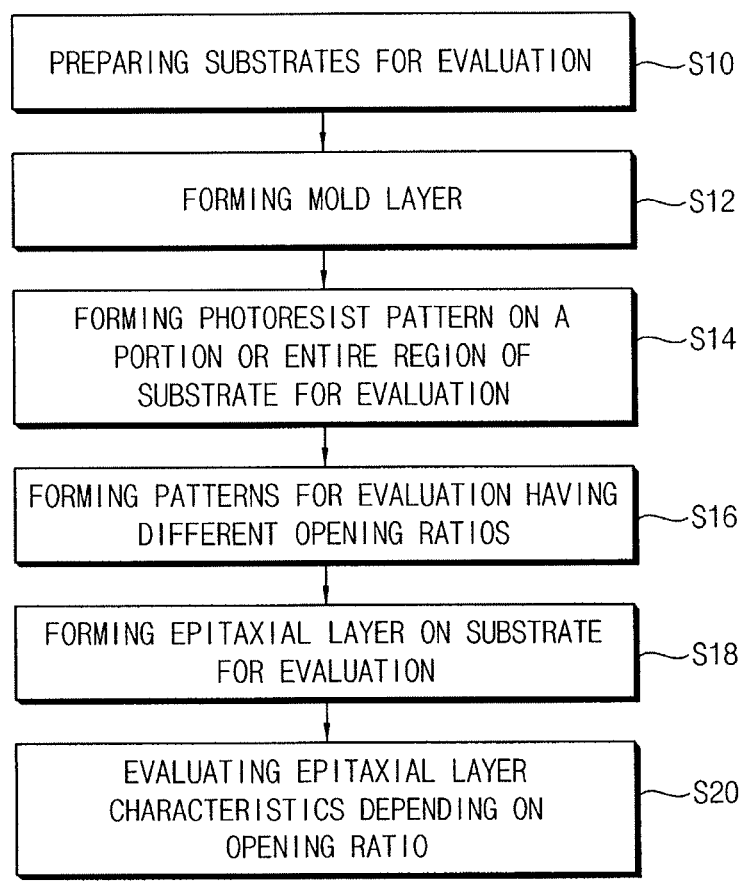
FIG. 1 illustrates a flowchart of a method of evaluating an epitaxial layer growing process in accordance with a global loading effect.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 illustrates a flowchart of a method of evaluating an epitaxial layer growing process in accordance with a global loading effect. FIGS. 2A to 2E illustrate cross-sectional views of stages in a method of evaluating an epitaxial layer growing process on a substrate for evaluation.

Referring to FIGS. 1 and 2A to 2E, a method of evaluating an epitaxial growing process depending on a global loading effect is explained. The epitaxial layer growing process may be an epitaxial layer growing process applicable in a manufacturing process of a semiconductor device. Particularly, about eighty-one chips may be formed on one substrate for evaluation. One chip may be processed during one cycle of an exposing process. However, the maximum number of chips formed on the substrate may vary in accordance with the kind of semiconductor device to be formed. The number of chips to be processed during one cycle of an exposing process may also vary. Hereinafter, a region formed in one cycle will be termed a one chip region.

Referring to FIGS. 1 and 2A, a plurality of evaluation substrates 100 of the same type may be prepared for the evaluating process (Step S10). The evaluation substrates 100 may include an upper surface portion formed using a single crystalline silicon. The evaluation substrates 100 may include a silicon-on-insulator (SOI) substrate, a single crystalline silicon substrate, or the like. For example, five evaluation substrates may be prepared. The number of evaluation substrates 100 is not limited thereto, and may be increased or decreased.

Referring to FIGS. 1 and 2B, a mold layer 102 may be formed for each evaluation substrate 100 (S12). The mold layer 102 may be formed to have a thickness larger than a height of an epitaxial layer to be formed. The mold layer 102 may be formed using an insulating material. Alternatively, the mold layer 102 may be formed by integrating two or more different material layers. Particularly, the mold layer 102 may be formed by integrating a pad oxide layer 102a and a silicon nitride layer 102b.

The pad oxide layer 102a may be formed on the evaluation substrate 100. The pad oxide layer 102a may be formed to relieve a stress between the substrate 100 for the evaluation and the silicon nitride layer 102b formed on the pad oxide layer 102a. When the thickness of the pad oxide layer 102a is less than about 10 Å, the stress relieving effect between layers may be decreased and when the thickness of the pad oxide layer 102a exceeds about 150 Å, removal of the pad oxide layer 102a in a subsequent process may be difficult. Accordingly, the thickness of the pad oxide layer 102a may be in a range of from about 10 to about 150 Å. In an implementation, the thickness of the pad oxide layer 102a may be from about 80 to about 100 Å.

On the pad oxide layer 102a, a silicon nitride layer 102b may be formed. Particularly, the silicon nitride layer 102b may have a thickness of from about 500 to about 1,000 Å. After that, a photoresist layer (not shown) may be coated on the silicon nitride layer 102b.

Referring to FIGS. 1 and 2C, a photolithography may be performed with respect to the photoresist layer to obtain a photoresist pattern 104 as an etching mask to form patterns for performing the evaluation. The photoresist patterns 104 formed on the evaluation substrates 100 may include openings 105 exposing a different total area of bottom portions of the openings 105. For example, a total area of each of the mold layer 102 that is exposed may be different. The photoresist pattern 104 may be formed on a portion or an entire region of the substrate 100 (S14).

While performing the photolithography to form the photoresist pattern 104, an exposing mask suitable for an epitaxial layer growing process for manufacturing a semiconductor device, may be used. Accordingly, a separate exposing mask to evaluate an epitaxial layer growing process may not be necessary. In addition, the photoresist pattern 104 may be formed under conditions suitable for performing an exposing process for the manufacture of the semiconductor device.

The photoresist pattern 104 formed by using the exposing mask may include openings having the same size. Alternatively, the photoresist pattern 104 formed by using the exposing mask may include various types of openings having various sizes and density value in accordance with regions. The openings may have a circular shape or a line shape.

In order to form various kinds of patterns on the evaluation substrate 100, the photoresist pattern 104 may not be formed in every chip region 101 across an entire surface portion of the evaluation substrate 100. The photoresist pattern 104 may be formed only a portion of the chip regions omitted from a remaining portion chip regions. Accordingly, the number of the chip regions that include the photoresist pattern 104 in one evaluation substrate 100 may be different than another evaluation substrate 100. The evaluation substrate 100 may include a mosaic pattern formed by the chip regions that include the photoresist pattern 104 and the chip regions that do not include the photoresist pattern 104.

Hereinafter, methods of forming a photoresist pattern on a first, second, third, fourth, and fifth evaluation substrate (herein, "first to fifth substrates") may be explained in detail. However, the description related to forming the photoresist pattern is exemplary only. The number of the chip regions on which the photoresist pattern may be formed in each substrate for the evaluation may be different from what is specifically described herein.

Figure 3:
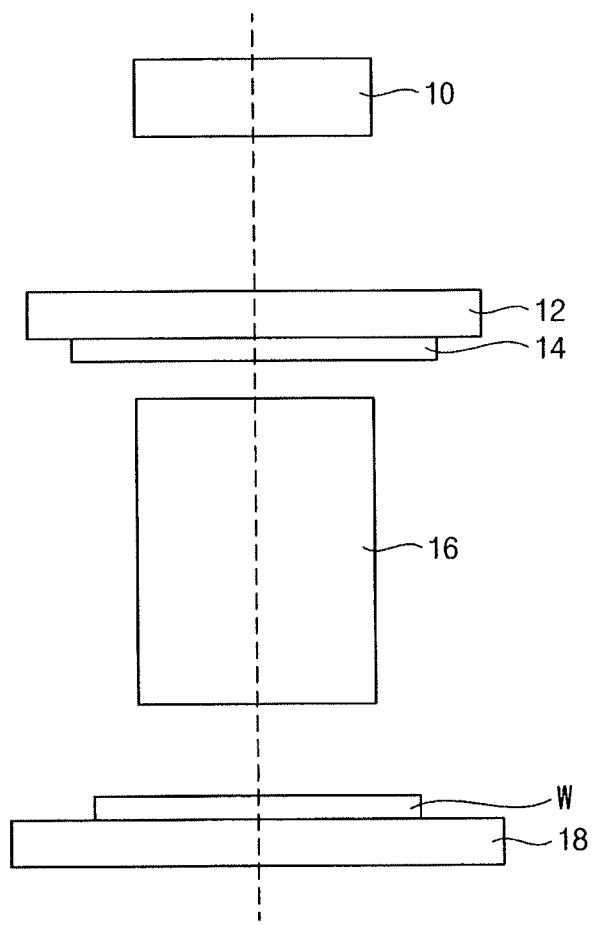
FIG. 3 illustrates an exposing apparatus for forming a photoresist pattern.

FIG. 3 illustrates an exposing apparatus for forming a photoresist pattern. FIGS. 4A to 4E illustrate plan views of chip regions where a photoresist pattern is to be formed for each substrate for evaluation.

The exposing apparatus in FIG. 3 may include an illumination optical system 10, a projection optical system 16, a reticle stage 12, an exposing mask 14, and a substrate stage 18. The photoresist pattern (FIG. 2C, 104) may be formed through an exposing process using the same exposing mask 14 on each evaluation substrate W. The number of chip regions where the exposing process may be performed may vary in accordance with the evaluation substrates W.

Figure 4A:
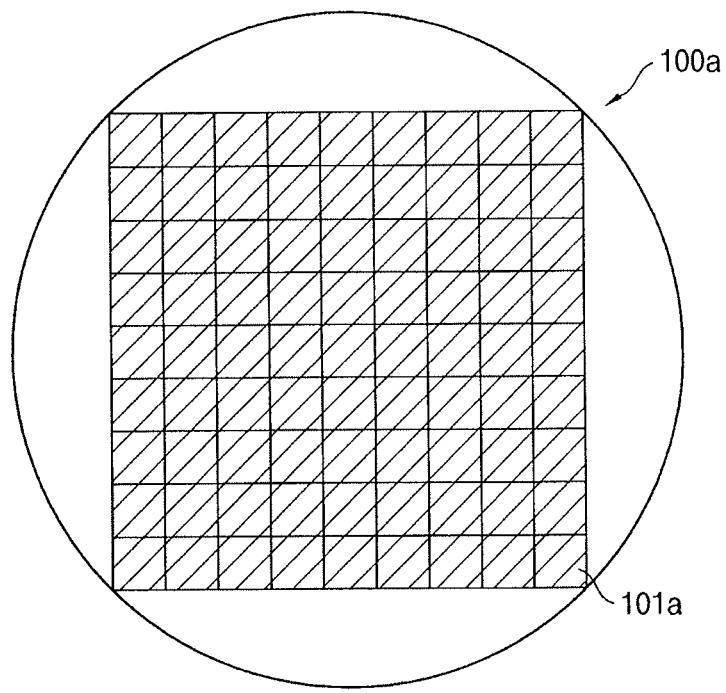
FIGS. 4A to 4E illustrate plan views of chip areas where a photoresist pattern is to be formed for each substrate for evaluation.

Referring to FIGS. 3 and 4A, an exposing process using the exposing mask 14 may be performed with respect to all of the eighty-one chip regions 101a on a first substrate 100a for evaluation. The photoresist pattern 104 may be formed on every designated chip region 101a, corresponding to 100% of an upper surface area of the first substrate 100a.

Figure 4B:
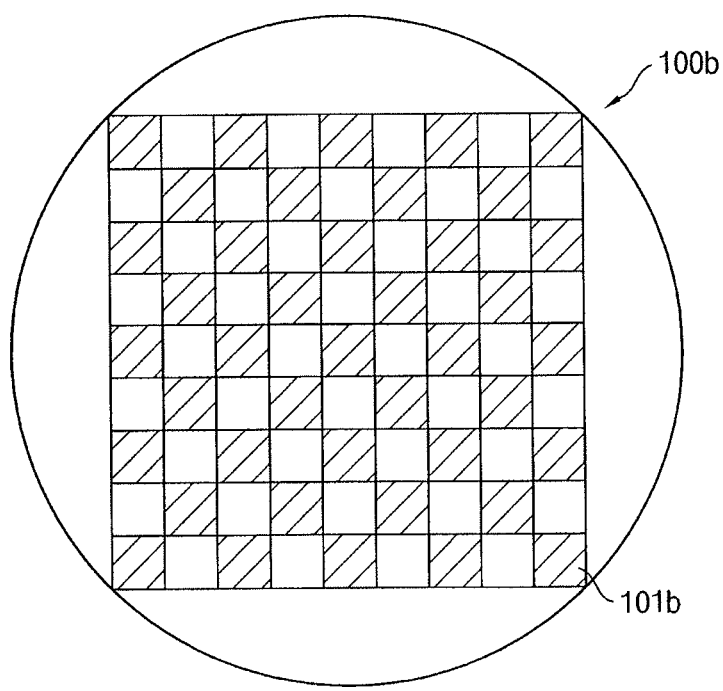

Referring to FIGS. 3 and 4B, an exposing process using the exposing mask 14 may be performed with respect to some chip regions, for example, every other chip region of the eighty-one chip regions on a second substrate 100b for evaluation. The exposing process may be performed with respect to the designated forty-one chip regions 101b of the eighty-one chip regions. The photoresist pattern 104 may be formed on every designated chip region 101b, corresponding to about 50.6% of an upper surface area of the second substrate 100b.

Figure 4C:
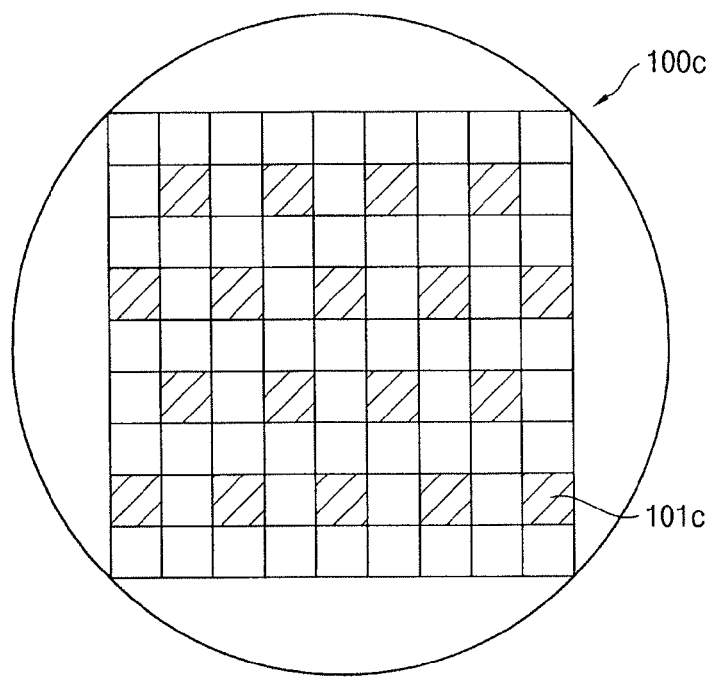

Referring to FIGS. 3 and 4C, an exposing process using the exposing mask 14 may be performed with respect to some chip regions, e.g., every other chip region in one row and none of the chip regions in a subsequent row on a third substrate 100c for evaluation. The exposing process may be performed with respect to the designated eighteen chip regions 101c of the eighty-one chip regions. The photoresist pattern 104 may be formed on every designated chip region 101c, corresponding to 22% of an upper surface area of the third substrate 100c.

Figure 4D:
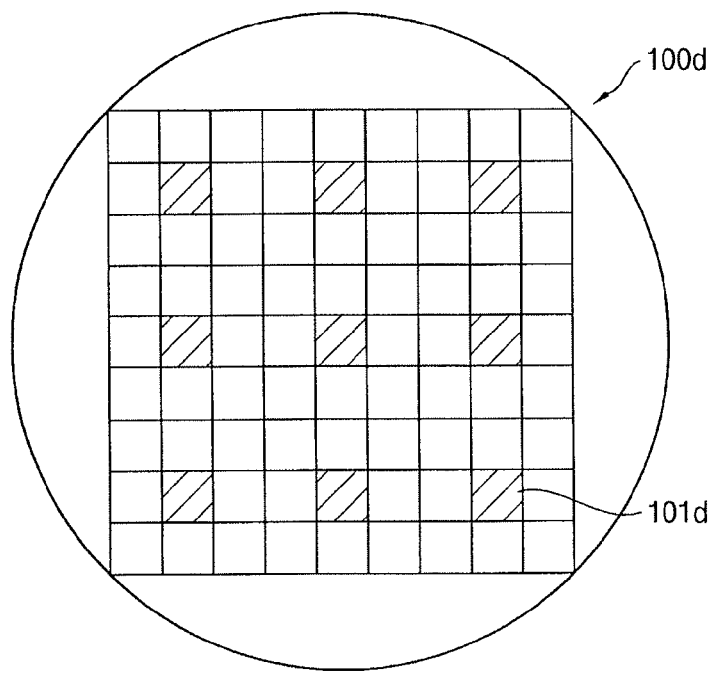

Referring to FIGS. 3 and 4D, an exposing process using the exposing mask 14 may be performed with respect to some chip regions selected by skipping chips so as to space out two lines along a column and row among all of the 81 chip regions on a fourth substrate 100d for the evaluation, e.g., the $2^{nd}$, $5^{th}$, $8^{th}$ chip regions of $2^{nd}$, $5^{th}$, and $8^{th}$ column of the eighty-one chip regions on a fourth substrate 100d for the evaluation. The exposing process may be performed with respect to the designated 41 chip regions 101b among all of the 81 chip regions. The exposing process may be performed with respect to the designated nine chip regions 101d of the 81 chip regions. The photoresist pattern 104 may be formed on every designated chip region 101d, corresponding to 11% of an upper surface area of the fourth substrate 100d.

Figure 4E:
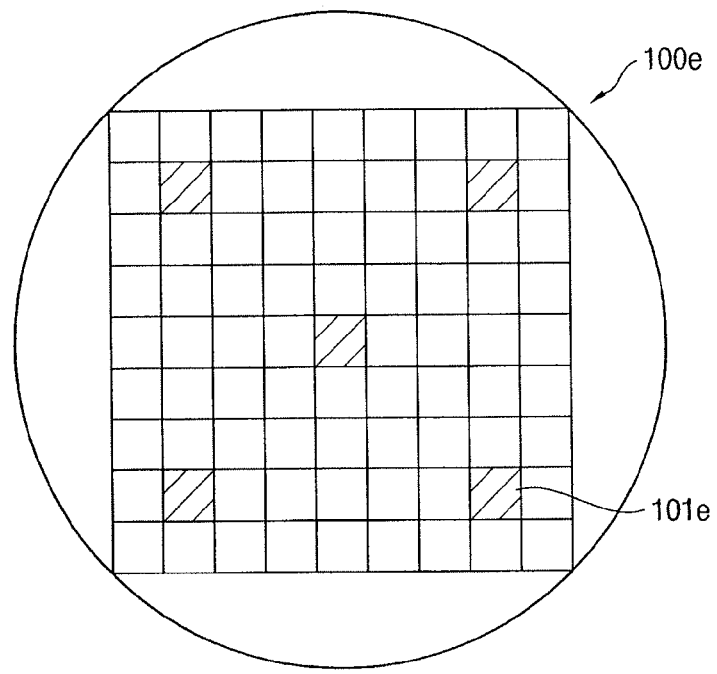

Referring to FIGS. 3 and 4E, an exposing process using the exposing mask 14 may be performed with respect to some chip regions selected by skipping chips so as to space out two more lines along a column and row when compared to the chip regions illustrated in FIG. 4C among all of the 81 chip regions on a fifth substrate 100e for the evaluation, e.g., $2^{nd}$ and $8^{th}$ chip regions of a second column, a $5^{th}$ chip region of a $5^{th}$ column, and a $2^{nd}$ and $8^{th}$ chip region of an $8^{th}$ column of the eighty-one chip regions on a fifth substrate 100e for the evaluation. The exposing process may be performed with respect to the designated five chip regions 101e of the eighty-one chip regions. The photoresist pattern 104 may be formed on every designated chip region 101e, corresponding to 6.2% of an upper surface area of the fifth substrate 100e.

Referring to FIGS. 1 and 2D again along with FIGS. 4A to 4E, the mold layer 102 may be etched to expose surface portions of the evaluation substrates 100, i.e., the first to fifth substrates 100a, 100b, 100c, 100d and 100e, using the photoresist patterns 104 formed on the first to fifth substrates 100a, 100b, 100c, 100d and 100e. The mold layer 102 may be etched to form patterns 106 for evaluation. The pattern 106 may include opening portions 110 in the mold layer 102 or exposed surface portions of the evaluation substrates 100. When the mold layer 102 is formed from the pad oxide layer 102a and the silicon nitride layer 102b, the pattern 106 may include a pad oxide pattern 106a and a silicon nitride pattern 106b.

The patterns 106 may be formed on eighty-one chip regions 101a formed on all, i.e., 100% of the entire surface portion of the first substrate 100a. The patterns 106 for the evaluation may be formed on 50.6% of the entire surface portion of the second substrate 100b. The patterns 106 may be formed on 22% of the entire surface portion of the third substrate 100c. The patterns 106 may be formed on 11% of the entire surface portion of the fourth substrate 100d. The patterns 106 may be formed on 6.2% of the entire surface portion of the fifth substrate 100e.

Upper surface portions of the first to fifth substrates 100a~100e for the evaluation may be exposed through the openings 110, e.g., bottom portions of the openings, included in the patterns 106. According to an embodiment, one chip region of each the five kinds of chip regions 101a~101e may include patterns 106 having the same shape. Accordingly, the first to fifth substrates 100a~100e may have the same opening ratio of the substrate with respect to one chip region. Since, however, the number of chip regions that include the patterns 106 may be different for each of the first to fifth substrates 100a~100e, the opening ratios of the entire surface portion of the substrates as a whole, due to the patterns 106, may be different for each of the first to fifth substrates 100a~100e.

According to an embodiment, a substrate opening ratio for each of the substrates 100a~100e, in view of the entire upper surface portion of the substrates, is referred to herein as a first opening ratio. The first opening ratio may be determined by relating an opening ratio of one chip region including patterns (chip region ratio), to an opening ratio of the upper surface of an evaluation. The opening ratio of the evaluation substrate in one chip region may be called a chip region ratio or a second opening ratio.

The second opening ratio may represent an area of each substrate for the evaluation exposed by each pattern 106 for the evaluation in one chip region among the first to fifth chip regions 101a~101e when an area of one chip region among the first to fifth chip regions 101a~101e is set to 1. The second opening ratio may be dependent on an area of the opening portions of the exposing mask for forming the patterns 106 for the evaluation.

When the second opening ratio of each exposing mask is 0.3, 0.2, or 0.1, the first opening ratio for each substrate for the evaluation may be calculated as described below.

When the second opening ratio is 0.3, the first opening ratio of each substrate for the evaluation may be illustrated in Table 1.

TABLE 1

|  | $1^{st}$ substrate | $2^{nd}$ substrate | $3^{rd}$ substrate | $4^{th}$ substrate | $5^{th}$ substrate |
|---|---|---|---|---|---|
| Calculating method | 0.3 × 100% | 0.3 × 50.6% | 0.3 × 22% | 0.3 × 11% | 0.3 × 6.2% |
| First opening ratio | 30% | 15.18% | 6.6% | 3.3% | 1.86% |

When the second opening ratio is 0.2, the first opening ratio of each substrate for the evaluation may be illustrated in Table 2.

TABLE 2

|  | $1^{st}$ substrate | $2^{nd}$ substrate | $3^{rd}$ substrate | $4^{th}$ substrate | $5^{th}$ substrate |
|---|---|---|---|---|---|
| Calculating method | 0.2 × 100% | 0.2 × 50.6% | 0.2 × 22% | 0.2 × 11% | 0.2 × 6.2% |
| First opening ratio | 20% | 10.12% | 4.4% | 2.2% | 1.24% |

When the second opening ratio is 0.1, the first opening ratio of each substrate for the evaluation may be illustrated in Table 3.

TABLE 3

|  | $1^{st}$ substrate | $2^{nd}$ substrate | $3^{rd}$ substrate | $4^{th}$ substrate | $5^{th}$ substrate |
|---|---|---|---|---|---|
| Calculating method | 0.1 × 100% | 0.1 × 50.6% | 0.1 × 22% | 0.1 × 11% | 0.1 × 6.2% |
| First opening ratio | 10% | 5.06% | 2.2% | 1.1% | 0.62% |

As described above, patterns 106 for the evaluation having different first opening ratios may be formed on each of the first to fifth substrates 100a~100e for the evaluation (FIG. 1, S16).

When the first opening ratio of the first to fifth substrates 100a~100e for evaluation exceeds 30% or is less than 5%, an accurate evaluation of the global loading effect may be difficult. Accordingly, the first opening ratio of the first to fifth substrates 100a~100e for evaluation may be within a range of from about 5 to about 30%.

The first opening ratio may be varied by controlling the number of the chip regions 101a~101e including the photoresist pattern 104 on the first to fifth substrates 100a~100e. In addition, the first opening ratio with respect to the entire surface portion of the substrate may vary in accordance with the second opening ratio. When the second opening ratio is less than 0.05, the range of the first opening ratio of detecting for each substrate 100a~100e for evaluation may become very small. On the contrary, when the second opening ratio is larger than 0.5, the first opening ratio of detecting for each substrate 100a~100e for evaluation may become too large and an accurate detection may be difficult. An appropriate range of the second opening ratio for evaluation may be from 0.05 to 0.5 in accordance with example embodiments.

Each pattern 106 for evaluation formed on each substrate among the first to fifth substrates 100a~100e for evaluation may illustrate different density values over the entire upper surface portion of the substrates 100a~100e for evaluation. A process characteristic difference generated in accordance with a difference of the first opening ratio may be called a global loading effect. By using an epitaxial layer formed in a subsequent process on the first to fifth substrates 100a~100e for evaluation, an epitaxial layer growing characteristic difference in accordance with the global loading effect may be easily evaluated.

The entire portion of the first to fifth substrates 100a~100e for evaluation may be cleaned. Through the cleaning process, naturally formed oxide layers and particles formed within the opening portions 110, e.g., on a bottom portion of the opening portions, of the patterns 106 for evaluation may be removed.

Figure 2D:
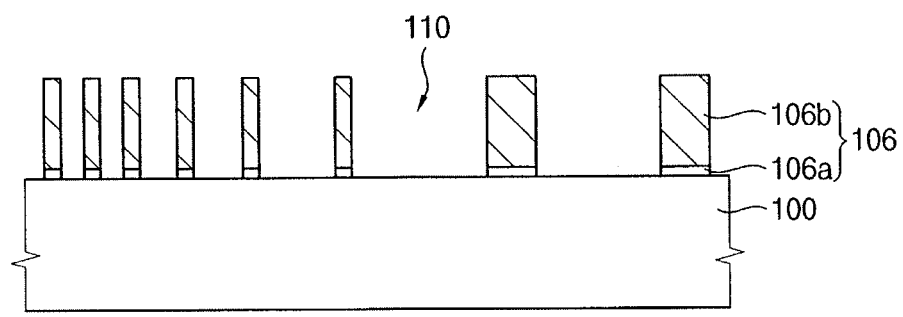
Figure 2E:
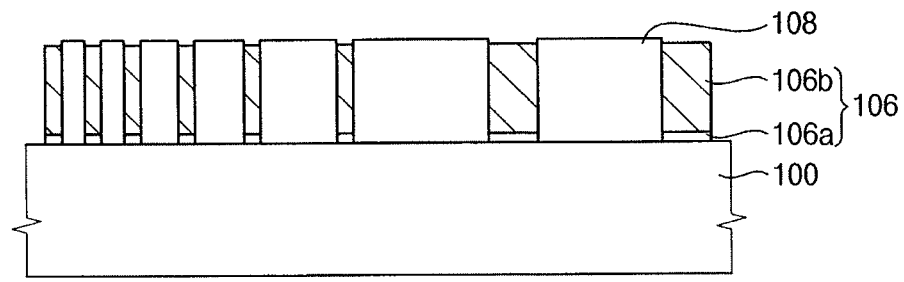

Referring to FIG. 2E, a selective epitaxial growing process may be performed on the first to fifth substrates 100a~100e for the evaluation by applying the same depositing condition to form an epitaxial layer 108 (FIG. 1, S18). The epitaxial layer 108 may be formed as silicon, silicon germanium, silicon carbide, etc.

The epitaxial layer 108 may be formed by performing one of an atmospheric pressure chemical vapor deposition (APCVD) method, a low pressure chemical vapor deposition (LPCVD) method, a molecular beam epitaxial (MBE) method and a ultra-high vacuum chemical vapor deposition (UHV CVD) method. According to the deposition method, a processing temperature and a processing pressure may be determined.

When the epitaxial layer is formed as silicon germanium, $SiH_4$, $GeH_4$, or the like, may be used as a source gas for the deposition, and at least one gas among HCl, $H_2$ and $B_2H_6$ gas may be used. Further, a temperature range of from about 500° C. to about 800° C. may be applied while performing the deposition process.

The first opening ratio depends on an area of the first to fifth substrates 100a~100e exposed by the patterns 106 for the evaluation. As such, the first opening ratio of the first to fifth substrates 100a~100e may be different. Accordingly, the epitaxial layers 108 may have different properties even though the selective epitaxial growing process may be performed under the same process conditions.

The characteristics of the epitaxial layer 108 formed on each substrate 100a~100e for the evaluation may be evaluated (FIG. 1, S20). Particularly, a growing rate of the epitaxial layer 108 and an amount of elements included in the epitaxial layer 108 may be evaluated.

The growing rate of the epitaxial layer 108 in accordance with the first opening ratio may be evaluated by measuring a thickness of the epitaxial layer 108 formed on the first to fifth substrates 100a~100e. Particularly, when the first opening ratio is high, the growing rate of the epitaxial layer 108 may be relatively slowed down.

In addition, analysis on constituting elements of or elements included in the epitaxial layer 108 formed on the first to fifth substrates 100a~100e may be performed. The amount of elements included in the epitaxial layer 108 may be different depending on the first opening ratio. Particularly, when the epitaxial layer 108 is formed as silicon germanium, the germanium concentration included in each epitaxial layer 108 of the first to fifth substrates 100a~100e may be different. A relation of the first opening ratio and the germanium concentration in silicon germanium may be determined through analysis of the constituting elements of the epitaxial layer 108. Alternatively, when the epitaxial layer 108 is formed as silicon carbide, the carbon concentration included in each epitaxial layer 108 of the first to fifth substrates 100a~100e may be different. Accordingly, a relation of the first opening ratio and the carbon concentration in the epitaxial layer 108 may be determined through analysis of the constituting elements of the epitaxial layer 108.

As described above, patterns for the evaluating processes may provide differing opening ratios with respect to different substrates when an exposing mask for manufacturing a semiconductor device is used. A separate exposing mask for a test may not be needed. Accordingly, a characteristic change of an epitaxial layer, based on the global loading effect, may be accurately evaluated while performing the selective epitaxial growing process. In addition, costs for the evaluation of the characteristic change of the epitaxial layer depending on the global loading effect may, thereby, be reduced.

Hereinafter, a method of forming an epitaxial layer through optimizing an epitaxial layer growing process by using the characteristic change of the epitaxial layer depending on the global loading effect may be explained referring to FIGS. 2E, 4A to 4E, 5, and 6A to 6C.

Figure 5:
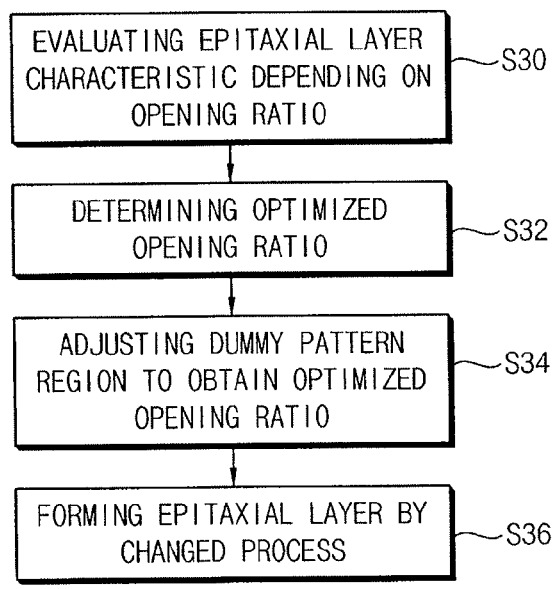
FIG. 5 illustrates a flowchart of a method of forming an epitaxial layer through an optimized growing process of an epitaxial layer.
Figure 6A:
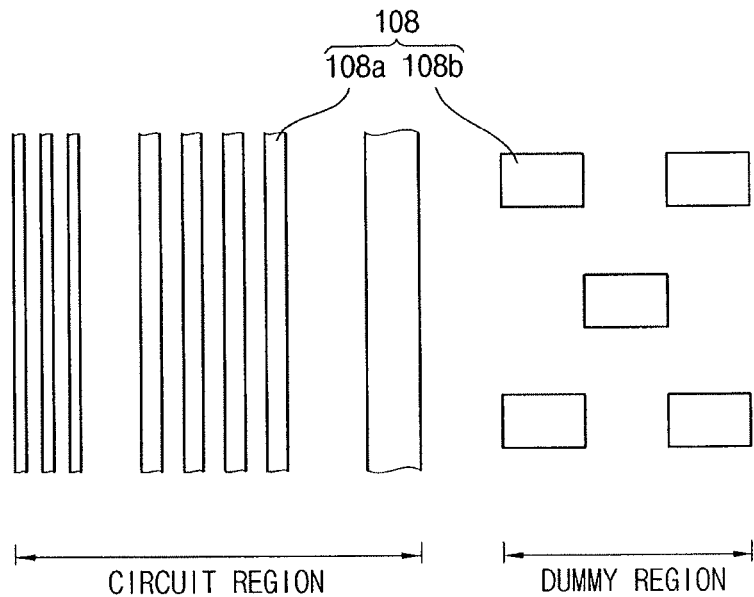
FIGS. 6A to 6C illustrate plan views of stages in a method of adjusting a first opening ratio by a dummy pattern.
Figure 6B:
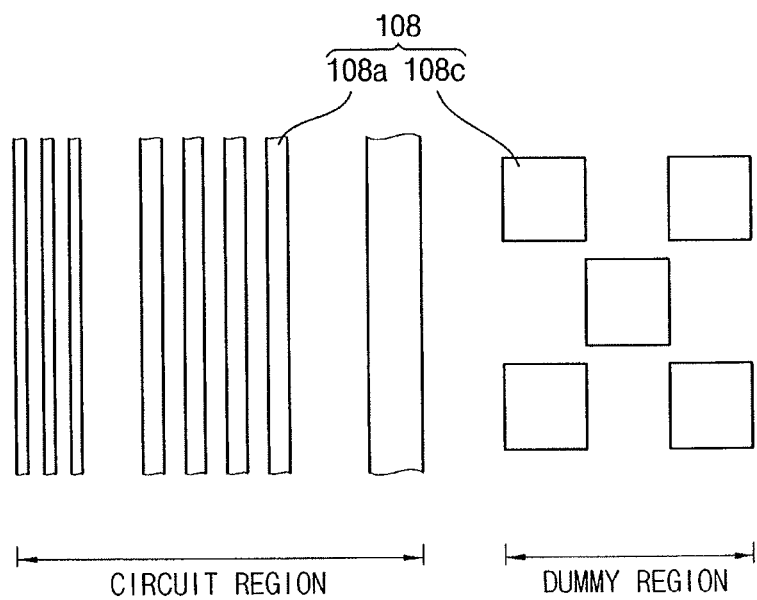
Figure 6C:
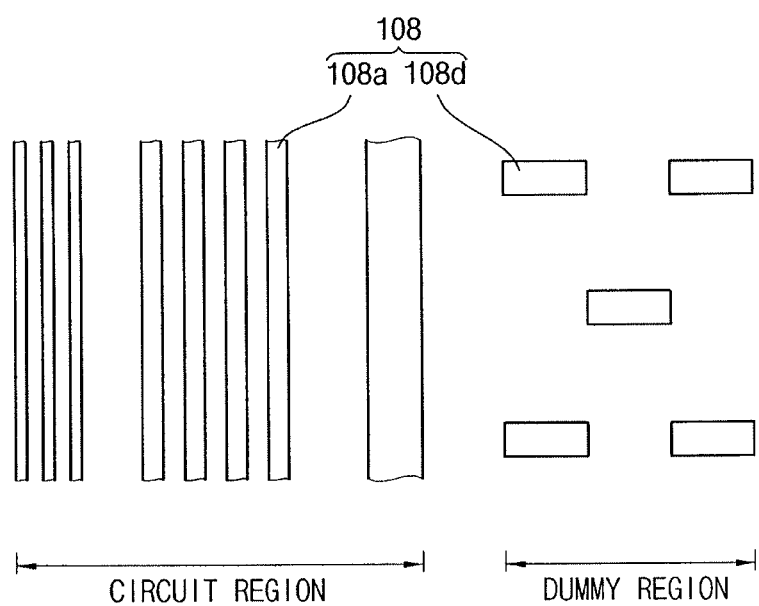

FIG. 5 illustrates a flowchart of a method of forming an epitaxial layer through an optimized growing process of an epitaxial layer. FIGS. 6A to 6C illustrate plan views of stages in a method of adjusting a first opening ratio by a dummy pattern.

A characteristic change of an epitaxial layer due to the global loading effect may be evaluated (S30) in the process, as described above with reference to FIG. 1.

The characteristic change of the epitaxial layer may be evaluated using the above-described first to fifth substrates 100a~100e and the pattern 106 having the second opening ratio of 0.3 formed in each chip. In this case, the characteristic change of the epitaxial layer 108 may be determined when the first opening ratio is 30%, 15.18%, 6.6%, 3.3% and 1.86% for the first to fifth substrates 100a~100e, respectively.

When the characteristic change of the epitaxial layer 108 associated with a first opening ratio is significant, a minute change of the first opening ratio during an epitaxial layer growing process may result in a large difference of the characteristics of the epitaxial layer 108. As a result, a process defect may be easily generated. According to an embodiment, a minute change of an optimal first opening ratio during the epitaxial layer growing process may result in little difference on the characteristics of the epitaxial layer 108 grown on the substrate. Accordingly, the characteristic change of the epitaxial layer 108 of the first to fifth substrates 100a~100e, may be considered to determine an optimal first opening ratio for the epitaxial growing process (S32). For example, a range of first opening ratio values, associated with little characteristic change of the epitaxial layer 108 of the first to fifth substrates 100a~100e, may be identified to determine optimal values for the first opening ratio. The optimal value of the first opening ratio may be a particular value within the identified range. According to an embodiment an optimal value of the first opening ratio may be one that is associated with a growing rate of the epitaxial layer 108 that is within 30%. According to an embodiment, an optimal value of the first opening ratio may be one that is associated with an amount ratio of elements included in the epitaxial layer 108 that is within 5%.

When the characteristic change of the epitaxial layer 108 formed on the second, third and fourth substrates 100b, 100c and 100d among the first to fifth substrates 100a~100e for the evaluation is small, an epitaxial layer 108 having a stable characteristic may be identified. According to an embodiment, the characteristic change of the epitaxial layer 108 is small when the first opening ratio is within a range of from 3.3% to 15.18%. Accordingly, the optimal first opening ratio may be a particular value within the range of from 3.3% to 15.18% while forming the epitaxial layer 108 in a manufacturing process of semiconductor devices.

An epitaxial growing process condition may be changed in order to apply the determined optimal first opening ratio (S34). The substrate may, thereby, have achieve the optimal first opening ratio during the epitaxial growing process over entire chip regions as illustrated in FIG. 4A.

In an implementation, the total area of bottom portions of the opening portions 110 of the mold layer pattern for forming the epitaxial layer 108 within the substrate may be adjusted during manufacturing of the semiconductor devices, in order to change the first opening ratio. In other words, the opening portions 110 may be adjusted to expose more or less of the upper surface of the substrate 110. The opening portions 110 of the mold layer pattern may include opening portions formed in a region that includes circuit patterns of semiconductor devices and opening portions formed in a dummy region that does not include the circuit patterns of semiconductor devices. The opening portions 110 formed in the dummy region may be dummy patterns. In other words, a first opening ratio may be changed to the optimal first opening ratio, or controlled to be in the desired range, by adjusting the area of dummy patterns formed in the dummy region. The dummy patterns may be formed to include regularly repeating shapes.

In an implementation, an epitaxial growing process may be performed in the circuit region and in the dummy region of the substrate positioned in the chip regions to evaluate the epitaxial growing process. The epitaxial layer 108 including circuit patterns 108a and dummy patterns 108b may be formed as illustrated in FIG. 6A. In addition, an optimized first opening ratio for restraining a global loading effect may be determined through the evaluation of the epitaxial growing process.

According to some embodiments, an increase of the first opening ratio of an epitaxial growing process may be required, in order to achieve the optimal first opening ratio determined through the evaluation process. In this case, the circuit patterns 108a formed in the circuit region may have the same layout (described above with reference to FIG. 6A) except that the area of the dummy patterns 108c formed in the dummy region may be increased, as illustrated in FIG. 6B. The substrate may, thereby, achieve the optimal first opening ratio determined through the evaluation process while performing the epitaxial growing process across entire chip regions.

According to some embodiments, a decrease of the first opening ratio of an epitaxial growing process may be required, in order to achieve the optimal first opening ratio determined from the evaluation process. In an implementation, the circuit patterns 108a formed in the circuit region may have the same layout (described above with reference to FIG. 6A) except that the area of dummy patterns 108d formed in the dummy region as illustrated in FIG. 6C may be decreased. The substrate may, thereby, achieve the optimal first opening ratio determined through the evaluation process, while performing the epitaxial growing process across entire chip regions.

An epitaxial layer may be formed by the epitaxial growing process that is modified, as described above, to include the optimal first opening ratio (step S36).

As described above, the epitaxial layer growing process may be optimized so that the global loading effect may be minimized, through evaluation of the characteristic change of the epitaxial layer associated with the global loading effect. In addition, the global loading effect may be decreased while maintaining the depositing condition of the epitaxial layer and retaining the shapes of the circuit patterns. Further, an epitaxial layer having uniform characteristics may be formed through the optimized epitaxial growing process.

Another example embodiment of forming an epitaxial layer by an optimized growing process of an epitaxial layer, based on an evaluation of characteristic changes of the epitaxial layer associated with the global loading effect is described below.

Figure 7:
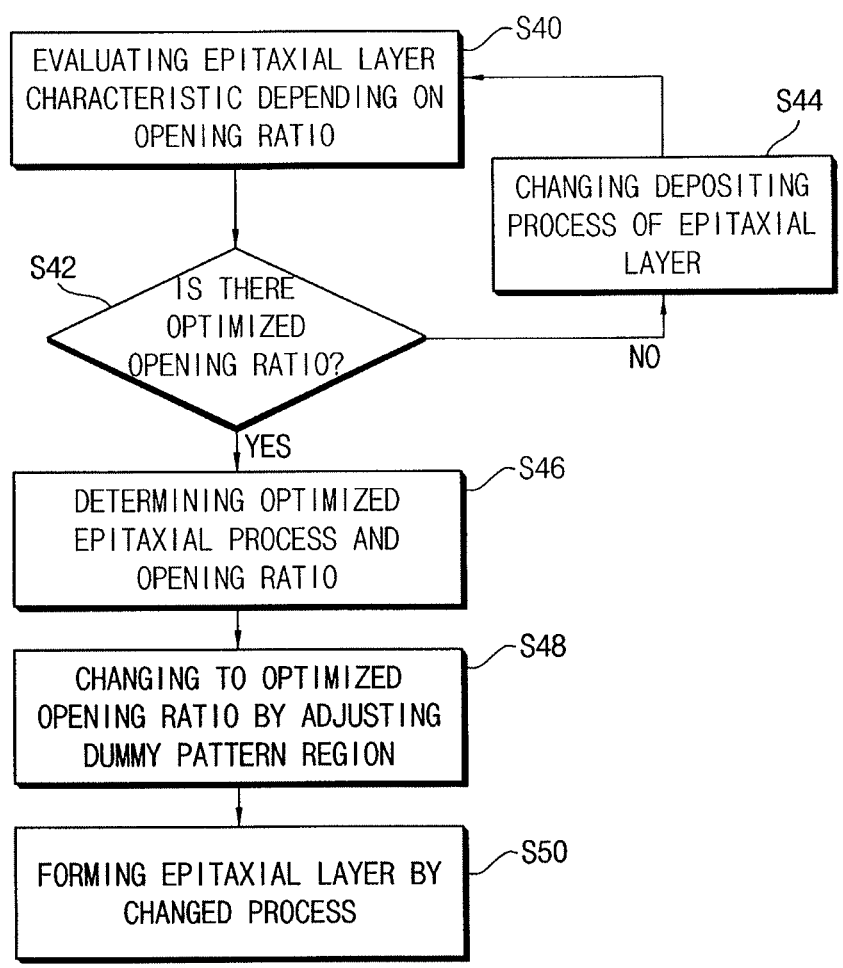
FIG. 7 illustrates a flowchart of another method of forming an epitaxial layer through an optimized growing process of an epitaxial layer.

FIG. 7 illustrates a flowchart of another method of forming an epitaxial layer through an optimized growing process of an epitaxial layer.

A characteristic change of an epitaxial layer depending on the global loading effect may be determined by performing the same evaluation process described above in reference to FIG. 1 (S40). Particularly, the characteristic change of the epitaxial layer 108 may be determined for the first to fifth substrates 100a~100e having a first opening ratio of 30%, 15.18%, 6.6%, 3.3% and 1.86%.

According to some embodiments, when the characteristic change of the grown epitaxial layer 108 in the first to fifth substrates 100a~100e shows a large difference, the epitaxial layer growing process conditions applied during the evaluation may not be applied. Particularly, when the characteristic difference of the epitaxial layer 108 is large for each of the first to fifth substrates 100a~100e, an appropriate opening ratio may be difficult to determine from the epitaxial process conditions applied during the evaluation.

Accordingly, a range of optimized first opening ratios determined through the evaluation result, if present, may be evaluated (S42).

When the optimal first opening ratio is not present or cannot be determined, the epitaxial layer 108 having a desired characteristic may not be achieved simply by changing the first opening ratio. In this event, at least one of the epitaxial depositing process conditions may be changed to form an epitaxial layer on the substrates for the evaluation (S44). For example, the epitaxial depositing process conditions for the epitaxial depositing process may include depositing temperature, a chamber pressure, a flowing amount of a source gas, a type of source gas, etc.

An epitaxial growing process with respect to sixth to tenth substrates for the evaluation may be performed by applying one or more changed conditions, as described above, in accordance with the process described with reference to FIGS. 2A to 2E. The characteristics of the resulting epitaxial layer may be evaluated again with respect to the global loading effect for each substrate for the evaluation (S40).

A confirming step may be implemented if an appropriate first opening ratio range may be identified while performing the epitaxial depositing process during the second evaluation (S42). An appropriate first opening ratio that is applicable to a pending epitaxial growing process may be determined based on the characteristic of the epitaxial layer grown on the sixth to tenth substrates (S46). For example, the first opening ratio range showing little characteristic change on the epitaxial layer 108 in the sixth to tenth substrates may be found, and a particular value within the range may be determined as the first opening ratio.

When the appropriate first opening ratio may not be determined because the characteristic change of the epitaxial layer 108 grown on the sixth to tenth substrates for the evaluation is large, the epitaxial growing process conditions may be changed again, in order to determine an optimized first opening ratio. The process of determining the first opening ratio may be repeated until an appropriate condition of the epitaxial layer depositing process may be identified.

In an implementation, the epitaxial layer forming process in a manufacturing process of semiconductor devices may be changed by altering the epitaxial growing process conditions, when determining the first opening ratio (S48). That is, the epitaxial layer depositing process conditions providing the optimized first opening ratio during performing the epitaxial growing process may be used. In addition, the area of the dummy patterns may be adjusted so that the determined optimal first opening ratio may be obtained.

An epitaxial layer may be formed using the epitaxial growing process that is modified, as described above, so as to achieve the determined optimal first opening ratio (S50).

As described above, an epitaxial depositing process condition and an opening ratio that may minimize the global loading effect may be achieved. An epitaxial layer having uniform characteristics may, thereby, be formed.

Figure 8:
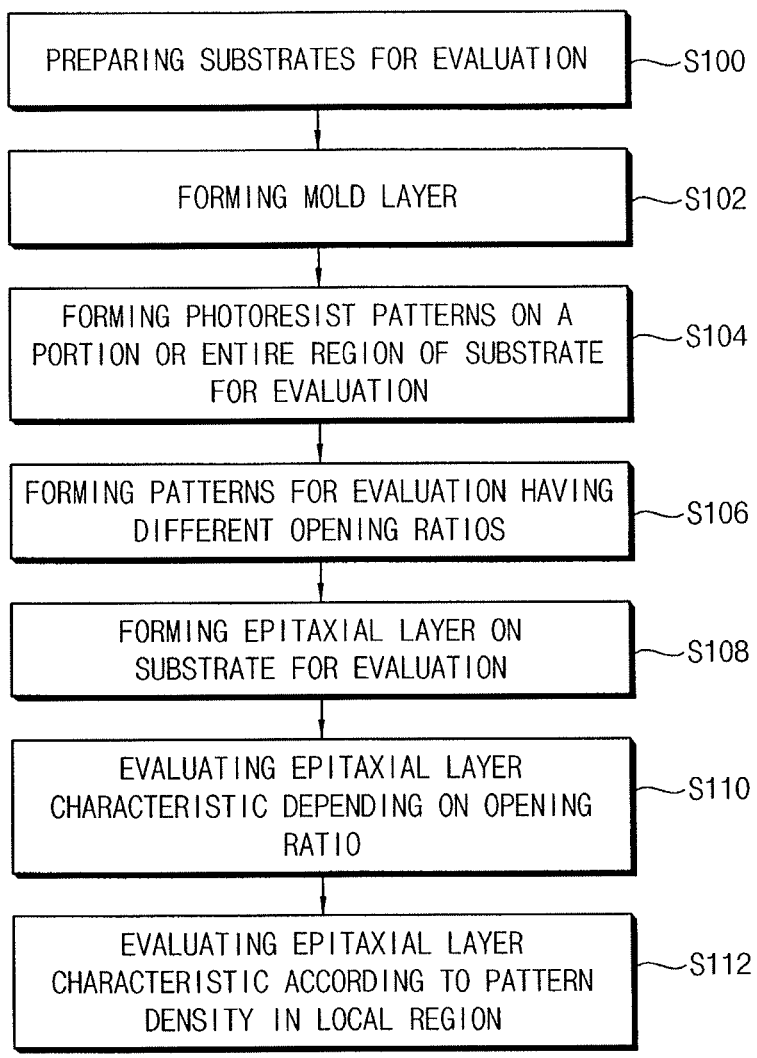
FIG. 8 illustrates a flowchart of a method of evaluating an epitaxial layer growing process for evaluating both a global loading effect and a micro loading effect.

FIG. 8 illustrates a flowchart of a method of evaluating an epitaxial layer growing process for both a global loading effect and a micro loading effect.

In accordance with example embodiments, a method of evaluating a global loading effect of the epitaxial layer growing process while manufacturing a semiconductor device, and the micro loading effect under a condition having different opening ratios of substrates will be described. According to an embodiment, eighty-one chips may be formed on one substrate and one or more chips may be formed during one cycle of an exposing process. However, the number of chips formed on one substrate may vary according to semiconductor devices, and the number of chips formed during one cycle of the exposing process may also vary.

The global loading effect may be the same as described above, with reference to FIGS. 1 and 2A to 2E. As such, a detailed explanation of the global loading effect will not be repeated. A method of evaluating the micro loading effect under different substrate opening ratio conditions is explained in detail below.

A plurality of the same substrates for evaluating a process may be prepared (S100). On each substrate for the evaluation, a mold layer may be formed (S102). The mold layer may be obtained by integrating a pad oxide layer and a pad nitride layer. Then, a photoresist layer may be coated on the pad nitride layer. These processes may be similar to those described above with reference to FIGS. 2A and 2B.

Photolithography process may be performed with respect to the photoresist layer formed on each substrate for evaluation, to form a photoresist pattern for forming various kinds of substrates for evaluation (S104). The photoresist pattern may expose a surface portion of the substrate for evaluation and may be provided as an etching mask for forming patterns for evaluation where a selective epitaxial growing process may occur. The photolithography for forming the photoresist pattern may be performed using an exposing mask pattern that is used for performing the epitaxial growing process or using another exposing mask pattern.

The photoresist pattern may be an etching mask for forming the patterns in order to evaluate the micro loading effect. In order to evaluate the micro loading effect, the patterns for the evaluation may be formed to have different densities of the opening portions, different widths of the opening portions 110 and different intervals between the opening portions 110. The photoresist pattern formed by using the exposing mask pattern may include patterns having repeated lines and spaces. The lines may have various different line widths in accordance with regions. In addition, the spacers between the lines may have various different line widths in accordance with regions. In addition, the photoresist pattern formed through the exposing mask pattern may include holes. The holes may have different diameters in each region and density of the holes may be different in accordance with regions.

According to an embodiment, the photoresist pattern may not be formed on all of the chip regions of the evaluation substrates, to facilitate preparing various kinds of evaluation substrates. The photoresist pattern may be formed on different numbers of chip regions for each evaluation substrate. The substrate may include a mosaic pattern formed by the chip regions that include the photoresist pattern and the chip regions that do not include the photoresist pattern. The photoresist pattern may be formed with respect to the first to fifth evaluation substrates, so that a ratio of patterns for evaluation in each chip region may be different.

The mold layer may be etched to expose a surface portion of the substrate for the evaluation by using the photoresist pattern formed on the substrate for the evaluation as an etching mask. The mold layer may become the pattern for evaluation, and may include the openings (S106).

On the first to fifth evaluation substrates, patterns having various different first opening ratios with respect to an entire upper surface portion of the substrate may be formed, as described previously. For example, each of the first to fifth substrates may have different pattern density (total number of patterns) with respect to the entire upper surface portion of each substrate.

The patterns formed in one chip region on each of the first to fifth substrates may have the same shape. The patterns may include a line shape or rectangular shape with different widths; and the distances between shapes may be different. In addition, the patterns for the evaluation may include circular holes having different diameters; and the distances between shapes may be different.

Particularly, the patterns for the evaluation may include at least first, second, and third pattern groups having different sizes. The first pattern group may include a first evaluation pattern in which openings have a line shape or rectangular shape with a first width. The openings of the first pattern group may be regularly arranged or evenly spaced from each other. The second pattern group may include a second pattern in which openings have a line shape or rectangular shape with a second width smaller than the first width. The openings of the second pattern group may be spaced evenly from each other. The third pattern group may include a third pattern in which openings have a line shape or rectangular shape with a third width smaller than the second width. The openings of the third pattern group may be evenly spaced from each other.

A procedural difference caused or generated by a change of the width and/or density of the line-shaped or rectangular-shaped openings, or the diameter or density of the circular openings, within a local region may be called a micro loading effect. The patterns formed in the chip regions on one of the first to fifth substrates may have the same shape, however, the micro loading effect may be different for each substrate for evaluation.

The first to fifth substrates may be thoroughly cleaned. Then, a selective epitaxial growing process may be performed with respect to the evaluation of the first to fifth substrates by applying the same depositing conditions to form an epitaxial layer (S108). The epitaxial layer may include silicon, silicon germanium, silicon carbide, etc. According to an embodiment, silicon germanium may be included in the epitaxial layer.

The first opening ratios may be different for each of the first to fifth substrates. Accordingly, epitaxial layers having different characteristics may be obtained even though the selective epitaxial growing process may be performed under the same conditions. The characteristics of the epitaxial layers formed on the first to fifth substrates may be evaluated to determine a characteristic change. For example, a growing rate of the epitaxial layer and an amount of elements included in the epitaxial layer may be evaluated. The characteristic change related to the growing rate of the epitaxial layer and the amount of elements included in the epitaxial layer associated with the difference of the first opening ratios may be evaluated for the first to fifth substrates (S110).

The characteristics of the epitaxial layer associated with the pattern density in one chip region of the first to fifth substrates may be evaluated (S112). For example, the growing rate of the epitaxial layer and the amount of elements included in the epitaxial layer may be evaluated by analyzing a thickness of the epitaxial layer. Also, components of the epitaxial layer, e.g., patterns having a line shape or rectangular shape of different widths with differing distances therebetween, positioned on one chip region of the first to fifth substrates, may be evaluated. Accordingly, the characteristic change in the growing rate of the epitaxial layer and the amount of the elements included in the epitaxial layer may be attributed to, for example, width of the openings, distances between openings, diameter of openings and/or density or number of openings in one chip region of the first to fifth substrates having different first opening ratios based on the patterns for evaluation.

As described above, the characteristic change of the epitaxial layer related to the global loading effect and the characteristic change of the epitaxial layer related to the micro loading effect in each chip region having different first opening ratios may be determined through analyzing the epitaxial layer formed on the first to fifth substrates for the evaluation.

Manufacturing process of semiconductor devices may be optimized based on the characteristic change of the epitaxial layer relating to the global loading effect and/or the micro loading effect. According to an embodiment, the optimization of the manufacturing process of the semiconductor devices may be achieved by applying the methods described with reference to FIG. 5, except that results of the characteristic change of the epitaxial layer, as described above, may not be needed. For example, the optimized first opening ratio, minimizing the global loading effect and the micro loading effect, may still be achieved; and a layout of a dummy pattern may be changed to achieve an optimal first opening ratio.

Alternatively, optimization of the manufacturing process of the semiconductor devices may be achieved by applying the method described above with reference to FIG. 7, except that the result of the characteristic change of the epitaxial layer may not be needed. For example, an optimized epitaxial processing condition and the first opening ratio that may minimize the global loading effect and the micro loading effect may be determined. Further, the process may include optimizing the epitaxial process conditions and modifying the layout of the dummy pattern, so as to achieve the optimal first opening ratio.

Hereinafter, a method of manufacturing a PMOS transistor by applying an optimized epitaxial layer forming process is described.

Figure 9:
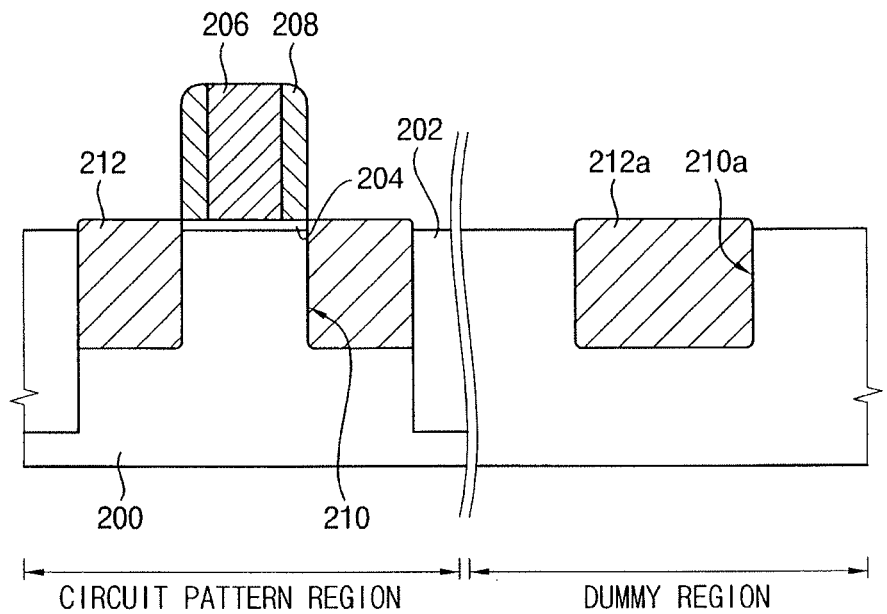
FIG. 9 illustrates a cross-sectional view of a PMOS transistor.

FIG. 9 illustrates a cross-sectional view of a PMOS transistor.

Referring to FIG. 9, a substrate 200 including an upper surface portion of single crystalline silicon may be prepared. The substrate 200 may be divided into an active region and a device isolation region by a device isolation layer pattern 202. The substrate 200 may include a circuit pattern region for forming a PMOS transistor and a dummy region not including circuit patterns. N-type impurities may be doped into a portion of the substrate 200 configured as a channel region of the PMOS transistor.

On the substrate 200 in the circuit pattern region, a gate insulating layer 204 may be provided. The gate insulating layer 204 may be formed using metal oxide having a high dielectricity. On the gate insulating layer 204, a gate electrode 206 may be formed. The gate electrode 206 may directly contact the gate insulating layer 204. The gate electrode 206 may include a metal.

A spacer 208 may be provided on each of opposing sidewall portions of the gate electrode 206.

A recess portion 210 may be formed in an upper surface portion of the substrate 200. The recess portion 210 may be adjacent opposing sides of the gate electrode 206. According to an embodiment, the recess portion 210 may correspond to a source/drain region of the PMOS transistor.

In the recess portion 210, a silicon germanium pattern 212 may be formed. The silicon germanium pattern 212 may fill up the recess portion 210. An upper portion of the silicon germanium pattern 212 or an entire portion of the silicon germanium pattern 212 may be doped with p+-type impurities. The doped portion having the p+-type impurities and the silicon germanium pattern 212 may be the source/drain region of a transistor.

Since the source/drain region may be formed in the silicon germanium pattern 212 in the PMOS transistor, a compressive stress may be applied to the channel region. A mobility of the PMOS transistor may be improved by the stress applied to the channel region. Accordingly, the performance of the PMOS transistor may be improved.

When the silicon germanium pattern 212 has non-uniform characteristics over an entire region of the substrate, but has a characteristic dispersion, the stress applied to the channel region of the PMOS transistor may also be non-uniform. Accordingly, a uniform electric characteristic may not be obtained over the entire region of the substrate in the PMOS transistor. A uniform growing process in forming the silicon germanium pattern 212 may be required.

A recess portion for dummy 210a may be formed in the dummy pattern region of the substrate 200. Within the recess portion for dummy 210a, a dummy silicon germanium pattern 212a may be provided.

Hereinafter, a method of manufacturing a PMOS transistor including a silicon germanium pattern having a reduced global loading effect and a uniform characteristic, is described.

Figure 10:
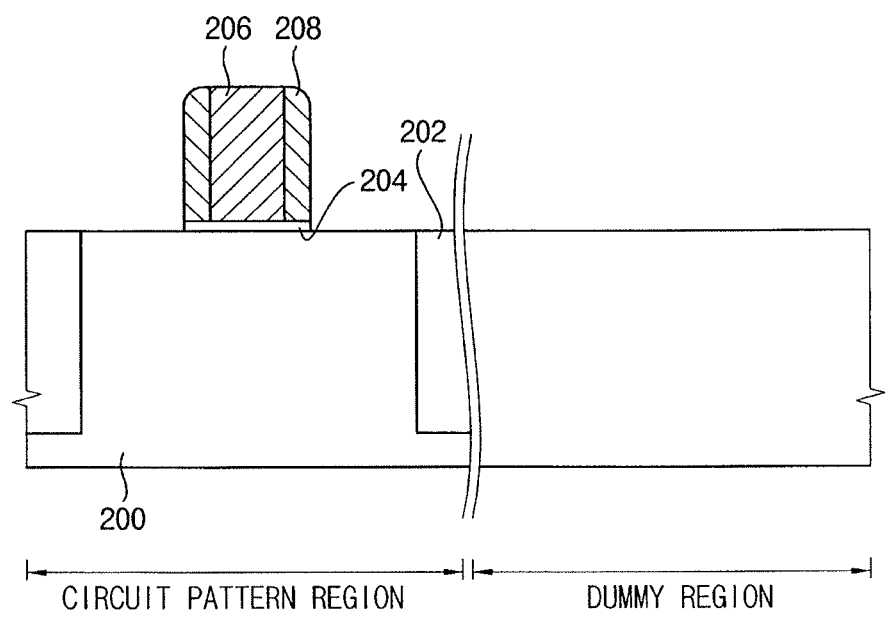
FIGS. 10 to 12 illustrate cross-sectional views of stages in a method of manufacturing the PMOS transistor illustrated in FIG. 9.
Figure 11:
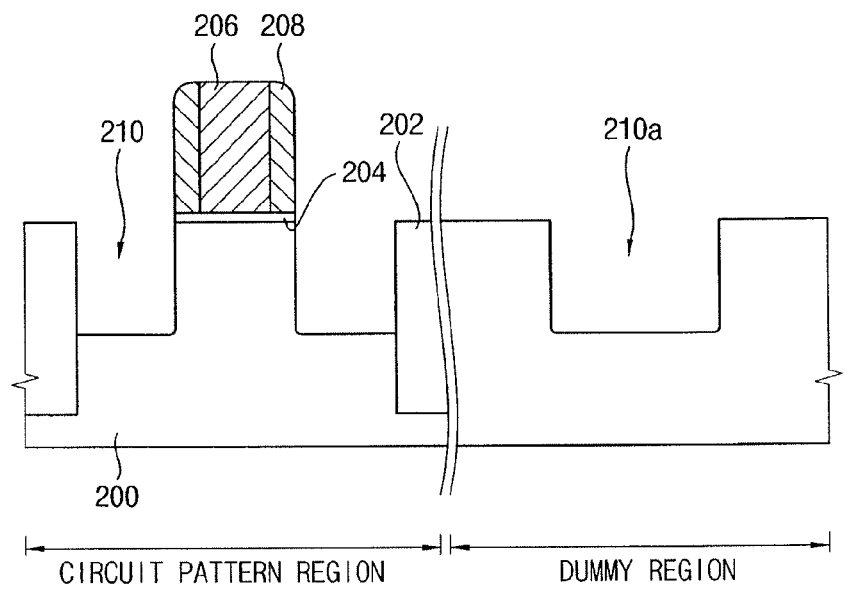
Figure 12:
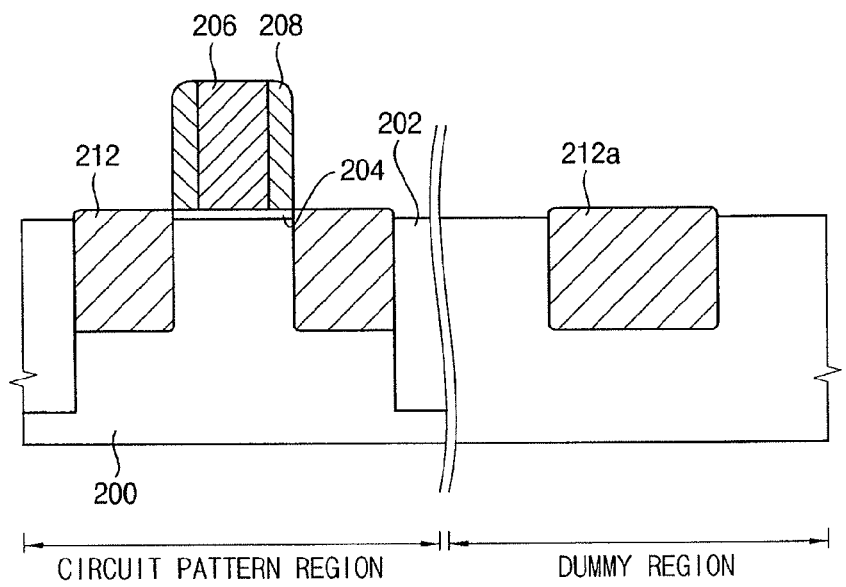

FIGS. 10 to 12 illustrate cross-sectional views of stages in a method of manufacturing a PMOS transistor illustrated in FIG. 9.

Referring to FIG. 10, a substrate 200, including an upper surface portion formed using single crystalline silicon, may be prepared. A single crystalline silicon substrate may be prepared as the substrate 200 in example embodiments. Alternatively, an SOI substrate may be used. The substrate 200 may be divided into a circuit pattern region and a dummy pattern region.

A device isolation layer pattern 202 may be formed through performing a device isolation process with respect to the substrate 200. The substrate 200 may be divided into an active region and a device isolation region.

A gate insulating layer 204 may be formed on the substrate 200. The gate insulating layer 204 may be formed by depositing metal oxide having a high dielectricity. A gate electrode 206 may be formed on the gate insulating layer 204. The gate electrode 206 may include a conductive layer pattern of a metal material and an upper mask pattern.

An insulating layer for a spacer 208 may be formed along surface portions of the gate electrode 206 and the gate insulating layer 204. The insulating layer for the spacer 208 may be formed using silicon nitride or silicon oxynitride. The spacer 208 may be formed on a sidewall portion of the gate electrode 206 by etching the insulating layer. An offset spacer may be formed between the sidewall portion of the gate electrode 206 and the spacer 208.

A recess portion 210 and a recess portion for dummy 210a may be formed by etching the substrate at side portions of each spacer 208 in the dummy region. Silicon germanium may be formed in the recess portion 210 and the recess portion for dummy 210a through a subsequent selective epitaxial growing process. However, optimized conditions to decrease an effect depending on the global loading effect using the above described method may be obtained before forming the recess portion 210 and performing the selective epitaxial growing process.

The process condition for forming a silicon germanium pattern 212 as described above with reference to FIG. 5 or 7, along with FIG. 1. The method for setting the process condition is explained briefly below.

First, characteristics of an epitaxial layer according to the first opening ratio may be evaluated by performing the process explained referring to FIG. 1.

A plurality of substrates of the same type may be prepared for evaluation. The substrate may be the same substrate 200 for manufacturing the PMOS transistor. A mold layer may be formed on the substrate 200. The mold layer may be formed to have a thickness of the same size and depth of the recess portion 210 formed in the source/drain region of the PMOS transistor, or somewhat larger than the depth of the recess portion 210. On the mold layer, a photoresist layer may be formed.

Then, the photoresist layer may be exposed using the photo mask applicable for formation of the recess portion 210 during manufacturing of the PMOS transistor. A developing process may be performed to form a photoresist pattern. In an implementation, the number of chip regions including the photoresist pattern may be different for each substrate for the evaluation.

The mold layer may be etched using the photoresist pattern as an etching mask to form patterns for evaluation, including openings exposing surface portions of the substrate for the evaluation. The openings may have the same width as the recess portion 210 formed in the source/drain region of the PMOS transistor. The patterns for the evaluation may have different first opening ratios for each substrate for evaluation.

Silicon germanium patterns may be formed by performing an initially set epitaxial growing process on the substrate including the patterns, respectively. Then, the silicon germanium patterns may be evaluated. Utilizing the evaluating result, an optimized process for forming the silicon germanium pattern may be obtained.

The optimized process may be obtained by a method described above, with reference to FIG. 5. An optimal first opening ratio that may minimize the global loading effect and the micro loading effect may be determined based on the results of the evaluation. Then, the layout of the dummy pattern may be changed so as to have the optimal first opening ratio.

The optimized process may be achieved by a method described above, with reference to FIG. 7. An optimized epitaxial process condition and an optimal first opening ratio that may minimize the global loading effect and the micro loading effect may be obtained from the results of the evaluation. Then, the process may be changed to achieve the optimized epitaxial process conditions and the layout of the dummy pattern may be changed to have the optimal first opening ratio.

Referring to FIG. 11, surface portions of the substrate 200 exposed at sides of each spacer 208 may be etched to form a recess portion 210 in the circuit pattern region. While forming the recess portion 210 in the circuit pattern region, a recess portion for dummy 210a for forming a dummy pattern may also be formed in the dummy region where a circuit pattern is not formed. A width and density of the recess portion for dummy 210a may be adjusted so that the substrate 200 may have an optimal first opening ratio.

Referring to FIG. 12, a silicon germanium pattern 212 and a dummy pattern 212a may be formed simultaneously in the recess portion 210 and the recess portion for dummy 210a by performing the epitaxial growing process. P-type impurities may be doped while forming the silicon germanium pattern 212 and the dummy pattern 212a in situ.

The selective epitaxial growing process for forming the silicon germanium pattern 212 and the dummy pattern 212a may be performed using the process conditions determined from the results of the evaluation of the substrates. Accordingly, the silicon germanium pattern 212 formed through the above described process may have a decreased global loading effect. The silicon germanium pattern 212 that is thereby formed, may have uniform characteristics over an entire region of the substrate 200 and a PMOS transistor having a high performance and little characteristic dispersion may be manufactured.

As described above, the characteristic evaluation of the epitaxial layer due to the global loading effect may be simply but accurately performed in accordance with example embodiments. For example, an epitaxial layer growing rate and an amount of elements included in the epitaxial layer depending on a global loading effect may be accurately evaluated. The characteristic evaluation may be utilized for optimization of a process for manufacturing semiconductor devices. For example, through evaluating the epitaxial growing aspects depending on the global loading effect accurately, an epitaxial layer having satisfactory characteristics required by semiconductor devices may be formed. The characteristic dispersion of the epitaxial layer may be decreased and generation of characteristic defects of the semiconductor devices due to the characteristic dispersion may be decreased or avoided. In addition, an influence depending on the global loading effect may be minimized while performing the epitaxial layer growing and a semiconductor device having uniform properties across an entire region of the substrate may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of evaluating an epitaxial growing process, the method comprising:
    forming a mold layer on each of a plurality of substrates;
    forming a photoresist pattern on each mold layer, the photoresist pattern having opening portions, a total area of a bottom portion of the opening portions being different for each substrate;
    patterning each mold layer to expose a surface portion of the substrate to form an evaluation pattern on each substrate, the evaluation pattern including opening portions corresponding to the opening portions in the photoresist pattern,
    determining substrate opening ratios for each substrate based on the opening portions in the evaluation pattern thereon, the substrate opening ratios being different for each substrate;
    performing a selective epitaxial process on each substrate to form an epitaxial layer; and
    evaluating characteristics of the epitaxial layer for each substrate to determine an optimal substrate opening ratio.

2. The method as claimed in claim 1, wherein the photoresist pattern is formed on a chip region of each substrate and each substrate includes a different number of chip regions exposed by the photoresist pattern.

3. The method as claimed in claim 2, wherein
the opening portions of the evaluation pattern in each chip region have a line shape or a circular shape and two or more different inner widths, and
the density of the substrate openings of each chip region is different.

4. The method as claimed in claim 3, further comprising evaluating characteristics of the epitaxial layer and a corresponding substrate opening ratio and a micro loading effect to identify an optimal substrate opening ratio associated with a low characteristic change.

5. The method as claimed in claim 2, wherein the photoresist patterns formed in each chip region have the same shape.

6. The method as claimed in claim 2, wherein the chip regions including the evaluation patterns are similarly arranged on the substrate and are uniformly disposed on an entire upper surface portion of the substrate.

7. The method as claimed in claim 2, wherein the photoresist pattern is formed using an exposing mask for forming the mold layer pattern for performing an epitaxial growing process.

8. The method as claimed in claim 1, wherein the substrate opening ratio of the substrate based on the evaluation patterns is between 5% and 30%.

9. The method as claimed in claim 1, wherein the characteristics of the epitaxial layer to be evaluated include an amount of elements contained in the epitaxial layer and a growing rate of the epitaxial layer.

10. The method as claimed in claim 1, wherein the epitaxial layer formed includes at least one of silicon germanium, single crystalline silicon, and silicon carbide.

11. A method of forming an epitaxial layer, the method comprising:
    forming a mold layer on each of a plurality of substrates;
    forming a photoresist pattern on each mold layer, the photoresist pattern having opening portions, a total area of a bottom portion of the opening portions being different for each substrate;
    patterning each mold layer to expose a surface portion of the substrate to form an evaluation pattern having opening portions corresponding to the opening portions of the photoresist pattern;
    determining a substrate opening ratio for each substrate based on the opening portions of the evaluation pattern, the substrate opening ratio of each substrate being different;
    performing a selective epitaxial process on each substrate to form an epitaxial layer;
    evaluating characteristics of the epitaxial layer and a corresponding substrate opening ratio;
    determining an optimal substrate opening ratio for forming the epitaxial layer based on the characteristics of the epitaxial layer;
    adjusting an epitaxial growing process condition to achieve the optimal substrate opening ratio; and
    forming a final epitaxial layer by applying the optimal substrate opening ratio.

12. The method as claimed in claim 11, wherein the photoresist pattern is formed using an exposing mask used for forming a mold layer pattern for performing an epitaxial growing process.

13. The method as claimed in claim 12, wherein the adjusting an epitaxial growing process condition to achieve the optimal substrate opening ratio includes adjusting an area of a dummy pattern included in the exposing mask.

14. The method as claimed in claim 13, wherein the dummy pattern has a regularly repeating shape.

15. The method as claimed in claim 11, wherein the optimal substrate opening ratio is within a range of substrate opening ratios associated with an epitaxial layer growing rate, the epitaxial layer growing rate being within 30%.

16. The method as claimed in claim 11, wherein the substrate opening ratio is within a range of substrate opening ratios associated with a difference of an amount of elements contained in the epitaxial layer, the difference of an amount of elements being within 5%.

17. The method as claimed in claim 11, wherein adjusting the epitaxial growing process condition to achieve the optimal substrate opening ratio includes changing a depositing process condition of the epitaxial layer.

18. A method of evaluating an epitaxial growing process, the method comprising:
    forming a mold layer on each of a plurality of substrates;
    patterning each mold layer to expose a surface portion of the substrate to form an evaluation pattern having opening portions;
    determining substrate opening ratios for each substrate based on the opening portions, the substrate opening ratios being different for each substrate;
    performing a selective epitaxial process on each substrate to form an epitaxial layer;
    evaluating characteristics of the epitaxial layer to identify a characteristic change for each substrate; and
    determining an optimal substrate opening ratio by identifying the substrate opening ratio corresponding to the least characteristic change.

* * * * *